United States Patent
Motta et al.

(10) Patent No.: US 7,242,253 B2
(45) Date of Patent: Jul. 10, 2007

(54) LOW NOISE AMPLIFIER

(75) Inventors: Carla Motta, Catania (IT); Giovanni Girlando, Catania (IT); Giuseppe Palmisano, San Giovanni La Punta (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 213 days.

(21) Appl. No.: 11/110,289

(22) Filed: Apr. 20, 2005

(65) Prior Publication Data

US 2005/0242887 A1    Nov. 3, 2005

(30) Foreign Application Priority Data

Apr. 30, 2004    (IT)    ............................. MI2004A0871

(51) Int. Cl.
*H03F 1/22*    (2006.01)

(52) U.S. Cl. .................................................... 330/311

(58) Field of Classification Search .................. 330/98, 330/99, 100, 311

See application file for complete search history.

(56) References Cited

U.S. PATENT DOCUMENTS 5,742,205 A * 4/1998 Cowen et al. .............. 330/269

\* cited by examiner

*Primary Examiner*—Steven J. Mottola
(74) *Attorney, Agent, or Firm*—Hogan & Hartson LLP

(57) ABSTRACT

A low noise amplifier includes a cascode device which includes at least a first and a second transistor having a terminal in common. The output terminal of the second transistor is the output terminal of the cascode device and is coupled to the output terminal of the amplifier. The amplifier includes a first circuit means suitable for the polarization of the second transistor. The first circuit means is positioned between a supply voltage and another terminal of the second transistor. The amplifier includes a second circuit means connected to the output terminal of the cascode device and is operative at a given frequency ($\omega$). The first circuit means includes a first series of a resistance and a capacitance and the second means has a second series of a resistance and a capacitance. The first series is coupled between the other terminal of the second transistor and ground and the second series is coupled between the output terminal of the cascode device and ground. The values of the resistances of the first and of the second series are much lower than the module values of the respective capacitive impedances of said first and of said second series at said given frequency ($\omega$).

19 Claims, 3 Drawing Sheets

LOW NOISE AMPLIFIER

FIELD OF THE INVENTION

The present invention relates to low noise amplifiers.

BACKGROUND OF THE INVENTION

Low noise amplifiers are frequently used in various electronic devices. A fundamental characteristic of such amplifiers is linearity.

A low noise amplifier can be considered as a non-linear system whose input-output characteristic can be modeled by a series of powers truncated at the third order. If the input signal Vi is constituted by two tones at respective frequencies $\omega 1$ and $\omega 2$, i.e., Vi=A1×cos($\omega 1$×t)+A2×cos($\omega 2$×t) with $\omega 1$ almost the same as $\omega 2$, with $\omega 1=\omega$ and $\omega 2-\omega 1<<\omega$ and A1=A2, we have linearity that can be characterised by a parameter of intermodulation of the third order IM3 in relation to a certain level of power of the two input tones or by the intercept of the third order IP3. In fact we have $$IM3 = 10\log\frac{P3}{P1}$$

where with P1 the power of the tone at $\omega 1$ is indicated while with P3 the power of the spurious tones at $2\omega 2-\omega 1$ or at $2\omega 1-\omega 2$ is indicated. As in a real amplifier the two spurious tones do not necessarily have equal Amplitude. There are two different IM3, i.e., the IM3low referred to the spurious tone $2\omega 2-\omega 1$ and the IM3high referred to the spurious tone $2\omega 1-\omega 2$ with IM3 being the maximum between IM3high and IM3low. The intercept of the third order IP3 of a non-linear system is linked to the parameter IM3 by the relation:

$$IIP3[dBm] = Pi[dBm] - \frac{IM3[dB]}{2}$$

where IIP3 is the intercept of the third order in input to the non-linear system and Pi is the power of the signal in input to said non-linear system; since in a real amplifier we have the parameters IM3high and IM3low, we also have the parameters IIP3high and IIP3low: In addition we have that the intercept of the third order OIP3 relative to the signal in output from the linear system is given by:

OIP3[dBm]=IIP3[dBm]+G[dB]

where G is the gain in decibels of said non-linear system. For OIP3 we have the parameters OIP3high and OIP3low.

A low noise amplifier that presents good performance in terms of linearity is shown in the article "Effect of out-of-band termination on intermodulation distortion in common-emitter circuits", IEEE MTT-S Dig., vol. 3, pages 977-980, June 1999 by V. Aparin and C. Persico. The low noise amplifier described comprises a bipolar transistor in common-emitter configuration and particular circuits for the polarization of the transistor, for the input adaptation and for the output adaptation. The parameter IM3 calculated for a bipolar transistor Q1 in common-emitter configuration, shown in FIG. 1, depends on numerous factors amongst which the impedances of input Z1, of load Z3 and of degeneration of emitter Z2. If the signal in input to the transistor Q1 is constituted by two tones at frequencies $\omega 1$ and $\omega 2$, we have that the parameter IM3 depends on values Z1, Z2 and Z3 at the frequency $\Delta\omega$ and at the frequency $2\omega$ where the frequency $\omega$ is equal to the frequency $\omega 1$ and almost the same as the frequency $\omega 2$ and $\Delta\omega=\omega 2-\omega 1<<\omega$. Therefore by suitable choosing the values Z1, Z2 and Z3 it is possible to minimize the parameter IM3 without influencing the performance of the circuit at the operative frequency $\omega$.

FIG. 2 shows the implementation of a low noise amplifier described in the abovementioned article. In the circuit topology described it is possible to set independently one from the other the values of the input impedance Zs at different frequencies, that is at the operative frequency $\omega$ (Zs(($\omega$))), at low frequency $\Delta\omega$ (Zs($\Delta\omega$)), and at double the operative frequency $2\omega$ (Zs($2\omega$)). The amplifier of FIG. 2 comprises a bipolar transistor Q2 and inductances Lb, Lc and Le connected to the respective base terminals, collector and emitter. The inductance Le is connected to a terminal of a microstrip ML4 having the other terminal connected to ground while the inductance Lc is connected to the supply voltage Vcc by means of the parallel of a resistance R3 and of another microstrip ML5. The inductance Lc is connected to the output terminal OUT by means of the series of an inductance L1 and a capacitance C5 in which another capacitance C4 is connected between the terminal in common of the inductance L1 and of the capacitance C5 and ground. The inductance Lb is connected to the supply voltage Vcc by means of the series of another microstrip ML3, a resistance R1 and a resistance R3; between the terminals of the resistance R1 and ground two capacitances C3 and C2 are positioned. The inductance Lb is connected to the input terminal IN by means of the series of another microstrip ML2 and of a capacitance C1; another microstrip ML1 is positioned between the terminal IN and ground. The capacitance C3 has a much higher value than the capacitances C1 and C2.

At the frequency $\Delta\omega$, since the capacitance C3 is a short circuit, the capacitances C1 and C2 are open elements and the values of the impedance offered by the inductance Lb and by the microstrip ML2 are almost nil, we have the input impedance Zs($\Delta\omega$) that is equal to the resistance R1.

At the frequencies $\omega$ and $2\omega$ the capacitances C1 and C2 have negligible impedances while the microstrip ML1, having length l1=$\lambda$/4, behaves like an open circuit at the frequency $\omega$ and like a short circuit at the frequency $2\omega$. Therefore at the frequency $\omega$ the impedance Zs depends on the inductance Lb and on the length l3 of the microstrip ML3. At the frequency $2\omega$ the impedance Zs depends on the inductance Lb, on the length l2 of the microstrip ML2 and on the length l3 of the microstrip ML3. Setting the length l3 and the inductance Lb at the operative frequency $\omega$ the resistance R1 and the length l2 of the microstrip ML2 can be chosen to vary the impedance Zs at the frequencies $\Delta\omega$ and $2\omega$ to obtain the maximum linearity. The microstrip ML5, having length $\lambda$/4, behaves like an open circuit at the frequency $\omega$ and like a short circuit at the frequencies $\Delta\omega$ and $2\omega$. Such a low noise amplifier has the disadvantages of poor insulation between input and output, a low stability and the interdependence between the output adaptation and that in input.

SUMMARY OF THE INVENTION

In view of the state of the art, an object of the present invention is to provide a low noise amplifier that overcomes the abovementioned inconveniences.

In accordance with the present invention this object is achieved by means of a low noise amplifier comprising a cascode device which includes at least a first and a second transistor having a terminal in common and the output terminal of the second transistor being the output terminal of the cascode device and being coupled to the output terminal of the amplifier. The first circuit means is suitable for the polarization of the second transistor and is positioned between a supply voltage and another terminal of the second. The second circuit means is connected to the output terminal of the cascode device and is suitable for its adaptation of output of the cascode device, with the amplifier perative at a given frequency such that the first circuit means includes a first series of a resistance and a capacitance and the second means includes a second series of a resistance and a capacitance, with the first series being coupled between said other terminal of the second transistor and ground and the second series being coupled between the output terminal of the cascode device and ground. The values of the resistances of the first and of the second series are much lower than the module values of the respective capacitive impedances of the first and of said second series at the given frequency.

Thanks to the present invention it is possible to provide a low noise amplifier that in addition to the qualities of the cascode amplifier has good linearity characteristics.

BRIEF DESCRIPTION OF THE DRAWINGS

The characteristics and advantages of the present invention will appear evident from the following detailed description of an embodiment thereof, illustrated as non-limiting example in the enclosed drawings, in which.

DETAILED DESCRIPTION

Figure 3:
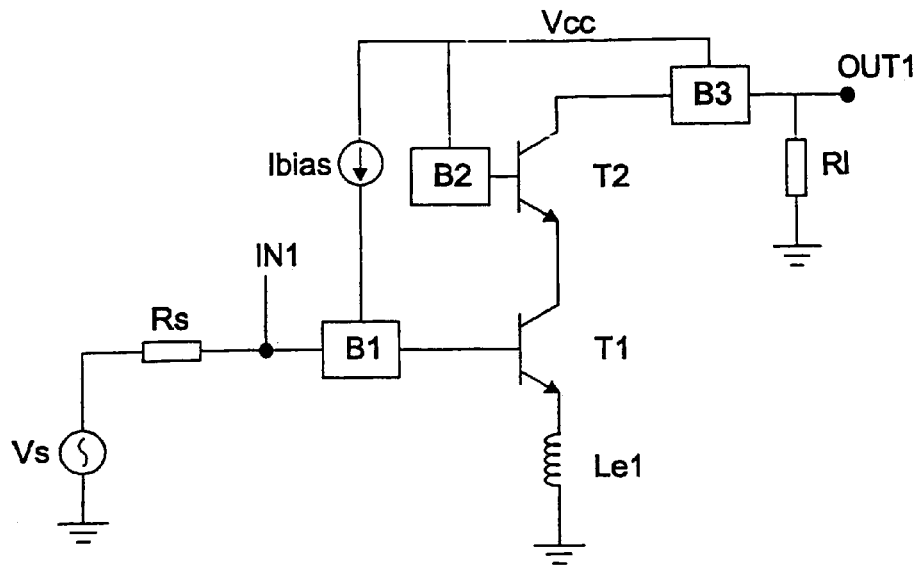
FIG. 3 is a circuit diagram of the amplifier according to the present invention.

FIG. 3 shows a circuit diagram of the low noise amplifier according to the present invention. The amplifier has an operative frequency $\omega$ and comprises a cascode device formed by at least a first transistor T1 and a second transistor T2 having a terminal in common and the output terminal of the second transistor being the output terminal of the cascode device. Preferably the transistors T1 and T2 are bipolar transistors and the transistor T2 is in a common base configuration. The amplifier comprises first circuit means B1 for the polarization and the adaptation of input of the first transistor T1, second circuit means B2 for the polarization of the second transistor T2 and third circuit means B3 for the adaptation of output of the cascode device T1-T2. The first means are connected to a polarization current generator Ibias having the other terminal connected to a supply voltage Vcc, to the input IN1 of the amplifier connected to a signal generator Vs having a resistance Rs and to the base terminal of the transistor T1. The second means B2 are connected between the supply voltage Vcc and the base terminal of the transistor T2 while the third means are connected between the supply voltage Vcc, the collector terminal of the transistor T2 and the output terminal OUT1 of the amplifier connected to a resistive load R1 in turn connected to ground. The emitter of the transistor T1 is connected to ground by means of an inductance Le1.

The second means B2 comprise a resistance Rb coupled between the base terminal of the transistor T2 and ground and the third means B3 comprise a resistance Rc coupled between the output terminal of the amplifier and ground. The resistances have such a small value that, calculating the impedances Zb, Zl of the second means B2 and of the third means B3 at the frequencies $\Delta\omega$, $\omega$ and $2\omega$, they are negligible at the frequencies $\omega$ and $2\omega$ but are not negligible at the lower frequencies, that is at the frequency $\Delta\omega$. In this manner the resistances Rb and Rc improve the linearity of the amplifier without influencing the other characteristics of the amplifier such as noise figure, the output adaptation and the low impedance on the base terminal of the transistor T2. The impedances Zb, Zl calculated for the second means B2 and for the third means B3 are the impedances seen respectively of a terminal of the transistor T2, i.e, from the base terminal, and from the output terminal of the transistor T2, i.e, the collector terminal of the transistor T2.

More precisely the second means B2 comprise a series of a resistance Rb and of a capacitance Cb; the series is connected between the base terminal of the transistor T2 and ground and is such that the value of the resistance Rb is much less, that is by at least an order of size, than the value in module of the capacitive impedance of the capacitance Cb calculated at the operating frequency of the amplifier, that is $$Rb << \left| \frac{1}{\omega Cb} \right|.$$

The third means B3 comprise a series of a resistance Rc and of a capacitance Cp; the series is coupled between the collector terminal of the transistor T2 and ground and is such that the value of the resistance Rc is much less, that is by at least an order of size, than the value in module of the capacitive impedance of the capacitance Cp calculated at the operating frequency $\omega$ of the amplifier, that is $$Rc << \left| \frac{1}{\omega Cp} \right|.$$

In this manner the resistances Rb and Rc do not influence the other characteristics of the amplifier.

Figure 4:
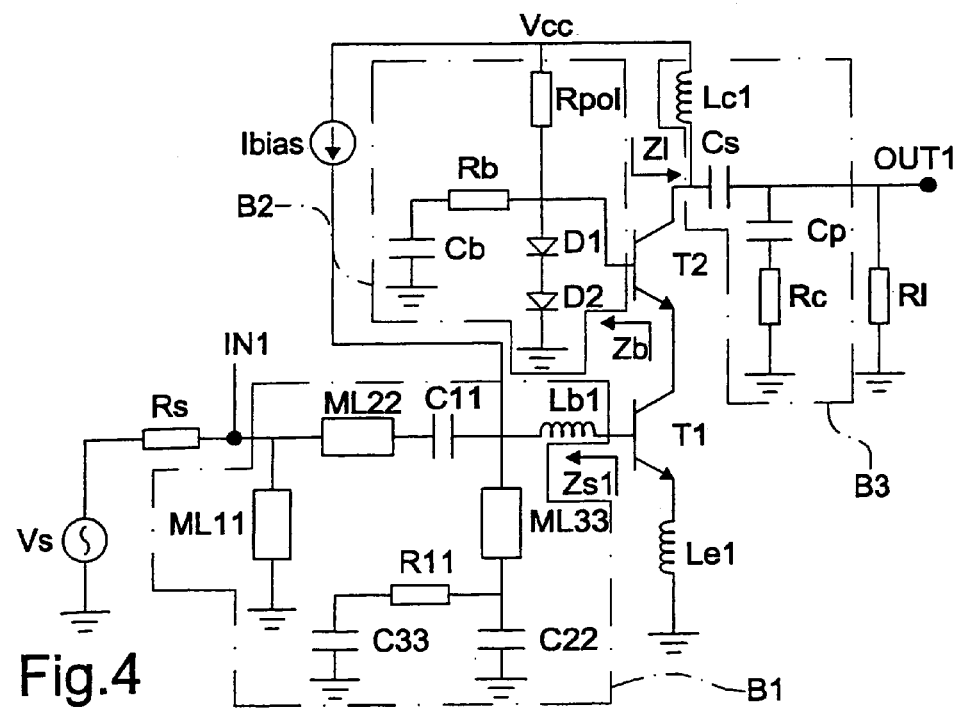
FIG. 4 is a more detailed circuit diagram of the amplifier of FIG. 3.

FIG. 4 shows a circuit implementation of the amplifier of FIG. 3. The second circuit means B2 comprise a resistance Rpol connected to the supply voltage Vcc and to the base terminal of the transistor T2, a series of two diodes D1 and D2 having respective cathode and anode in common and in which the anode of the diode D1 is connected with the base terminal of the transistor T2 and the cathode of the diode D2 is grounded and the series of the capacitor Cb and of the resistance Rb positioned between the base terminal of the transistor T2 and ground. The third circuit means B3 comprise an inductance Lc1 connected to the collector terminal of the transistor T2 and to the supply voltage Vcc, a first capacitor Cs positioned between said collector terminal and the resistive load R1 and the series of the capacitor Cp and of the resistance Rc connected between the other terminal of the capacitor Cs and ground.

The first circuit means B1 comprise an inductance Lb1 connected to the base terminal of the transistor T1 and to the current generator Ibias, a series of a microstrip ML33, a resistance R11 and a capacitor C33 positioned between a terminal of the inductance Lb1 and ground; between the terminal in common of the resistance R11 and of the microstrip ML33 and ground is positioned a capacitance C22. The inductance Lb1 is connected to the input terminal IN1 by means of the series of a capacitance C11 and of another microstrip ML22; another microstrip ML11 is positioned between the terminal IN1 and ground. The capacitance C33 has a much higher value than the capacitances C11 and C22.

At the frequency $\Delta\omega$, since the capacitance C33 is a short circuit, the capacitances C11 and C22 are open elements and the values of the impedance offered by the inductance Lb1 and by the microstrip ML22 are almost nil, we have the input impedance Zs1 ($\Delta\omega$), that is the impedance seen from the base terminal of the transistor T1, that is equal to the resistance R11.

At the frequencies $\omega$ and $2\omega$ the capacitance C22 has a negligible impedance while the microstrip ML11, having length l1=$\lambda$/4, behaves like an open circuit at the frequency $\omega$ and like a short circuit at the frequency $2\omega$. Therefore at the frequency $\omega$ the impedance Zs1 depends on the inductance Lb1, on the capacitance C11 and on the length l33 of the microstrip ML33. At the frequency $2\omega$ the impedance Zs1 depends on the inductance Lb1, on the capacitance C11, on the length l22 of the microstrip ML22 and on the length l33 of the microstrip ML33. Setting the length l33, the capacitance C11 and the inductance Lb1 at the operating frequency $\omega$ the resistance R11 and the length l22 of the microstrip ML2 can be chosen for varying the impedance Zs at the frequencies $\Delta\omega$ and $2\omega$ to obtain the maximum linearity.

Figure 1:
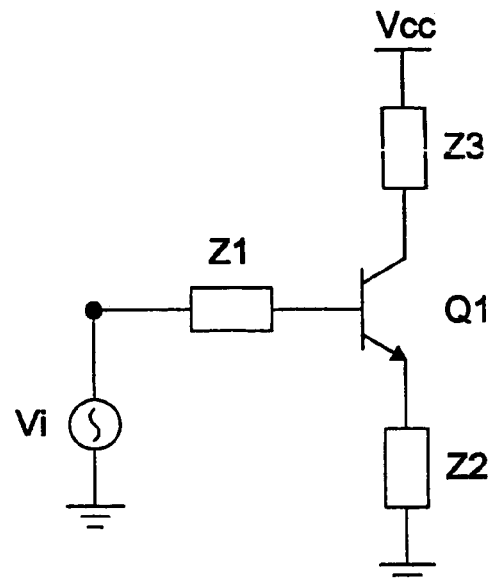
FIG. 1 is a circuit diagram of a common-emitter transistor.
Figure 2:
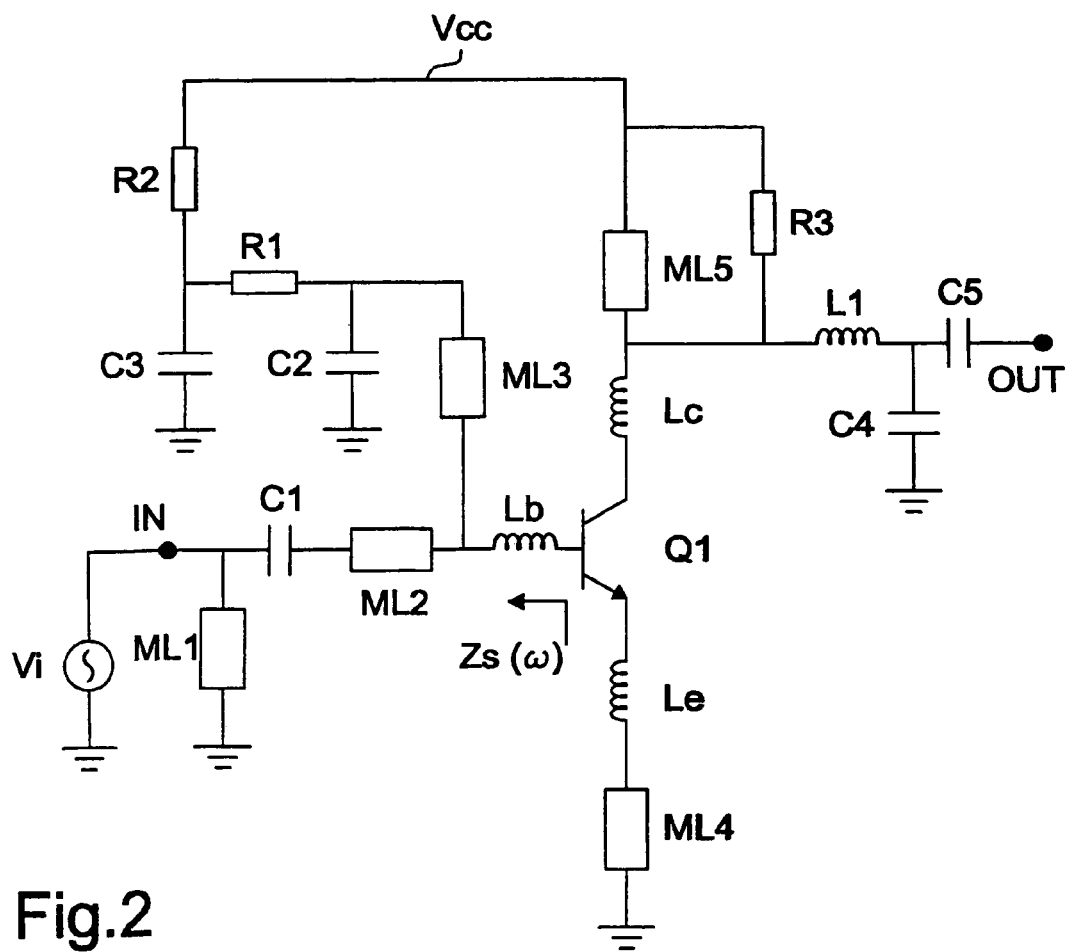
FIG. 2 is a circuit diagram of a low noise amplifier according to the known art.
Figure 5:
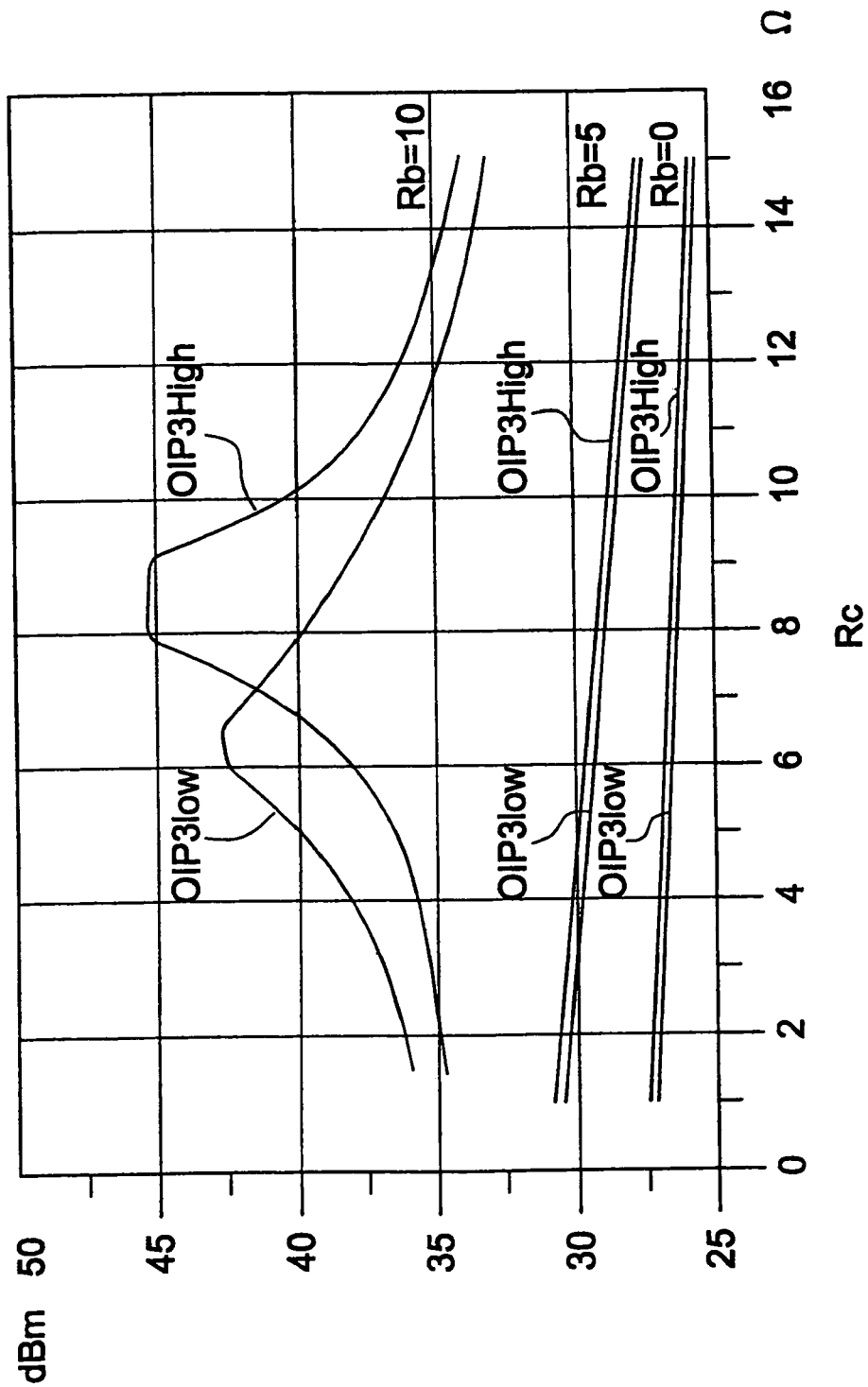
FIG. 5 shows the variation of the intercept of the third order in output upon variation of the collector resistance that is obtained from simulations carried out on the amplifier of FIG. 4.

FIG. 5 shows the diagram of the intercept of the third order in output OIP3 for three values of Rb (Rb=0, 5 $\Omega$, 10 $\Omega$) upon variation of the resistance Rc; the diagram derives from simulations made on the circuit of FIG. 4 in which is used Vcc=3V, the collector current of the transistor T2 Ic=4 mA, the operating frequency $\omega$=2 Ghz and in which there is a gain of 18 dB. More precisely FIG. 5 shows the diagram of two factors of the intercept of the third order in output the OIP3high and the OIP3low, expressed in dBm; the minimum of said two factors gives the value of the intercept of the third order. The best result is obtained with Rb=10 $\Omega$ and Rc=7 $\Omega$ with which we have the OIP3 that is about 41 dBm which is considerably greater than the OIP3 of the known circuit of FIG. 2; in this case in fact using VCC=2,7V, the collector current of the transistor Q2 Ic2=5 mA, the operative frequency $\omega$=2 Ghz and with a gain of 19 dB we obtain an OIP3 of 31 dBm. The values of the circuit elements of FIG. 4 used for the simulation are given in the following table:

| | |
|---|---|
| C11 | 5.1 pF |
| C22 | 100 pF |
| C33 | 1 µF |
| R11 | 20 $\Omega$ |
| l22 | 1.8 mm |
| l33 | 10 mm |
| Lb1 | 0.5 nH |

-continued

| | |
|---|---|
| Le1 | 0.6 nH |
| Cb | 3.7 pF |
| Rpol | 3 k$\Omega$ |
| Lc1 | 7 nH |
| Cs | 0.9 pF |
| Cp | 1.4 pF |

The invention claimed is:

1. A low noise amplifier comprising a cascade device, said cascade device comprising:
   at least a first and a second transistor having a terminal in common and the output terminal of the second transistor being the output terminal of the cascode device and being coupled to the output terminal of the amplifier,
   a first circuit being positioned between a supply voltage and another terminal of said second transistor, wherein said first circuit comprises a series of two diodes positioned between said another terminal of the second transistor and ground and a further resistance positioned between said another terminal of the second transistor and the supply voltage, and
   a second circuit coupled to the output terminal of the cascode device, wherein said amplifier is operative at a given frequency, said first circuit comprises a first series of a resistance and a capacitance and said second circuit comprises a second series of a resistance and a capacitance, said first series being coupled between said another terminal of the second transistor and ground and said second series being coupled between the output terminal of the cascode device and ground, the values of said resistances of the first and of the second series being substantially lower than the module values of the respective capacitive impedances of said first and of said second series at said given frequency.

2. The low noise amplifier according to claim 1, wherein the values of said resistances of the first and of the second series are lower by at least one order of magnitude than the module values of the respective capacitive impedances of said first and of said second series at said given frequency.

3. A low noise amplifier comprising a cascade device, said cascade device comprising:
   at least a first and a second transistor having a terminal in common and the output terminal of the second transistor being the output terminal of the cascode device and being coupled to the output terminal of the amplifier,
   a first circuit being positioned between a supply voltage and another terminal of said second transistor, and
   a second circuit coupled to the output terminal of the cascode device, wherein said amplifier is operative at a given frequency, said first circuit comprises a first series of a resistance and a capacitance and said second circuit comprises a second series of a resistance and a capacitance, said first series being coupled between said another terminal of the second transistor and ground and said second series being coupled between the output terminal of the cascode device and ground, the values of said resistances of the first and of the second series being substantially lower than the module values of the respective capacitive impedances of said first and of said second series at said given frequency, wherein said second circuit comprises an inductance coupled to the output terminal of the second transistor and said supply voltage and a further capacitance coupled between said output terminal of the second transistor and said second series.

4. A low noise amplifier comprising a cascode device, said cascode device comprising:
   at least a first and a second transistor having a terminal in common and the output terminal of the second transistor being the output terminal of the cascode device and being coupled to the output terminal of the amplifier,
   a first circuit being positioned between a supply voltage and another terminal of said second transistor, and
   a second circuit coupled to the output terminal of the cascode device, wherein said amplifier is operative at a given frequency, said first circuit comprises a first series of a resistance and a capacitance and said second comprises a second series of a resistance and a capacitance, said first series being coupled between said another terminal of the second transistor and ground and said second series being coupled between the output terminal of the cascode device and ground, the values of said resistances of the first and of the second series being substantially lower than the module values of the respective capacitive impedances of said first and of said second series at said given frequency,
wherein said first and second transistor are bipolar transistors and said another terminal of said second transistor is the base terminal.

5. The low noise amplifier according to claim 1, further comprising a third circuit coupled to the supply voltage and to a terminal of the first transistor.

6. A low noise amplifier comprising:
   an input node and an output node;
   a first bipolar transistor having a base, a collector, and an emitter coupled to ground;
   a second bipolar transistor having a base, a collector, and an emitter coupled to the collector of the first bipolar transistor;
   a first resistor-capacitor circuit coupled between the input node and the base of the first transistor;
   a second resistor-capacitor circuit coupled between the base of the second transistor and a source of power supply voltage; and
   a third resistor-capacitor circuit coupled between the collector of the second transistor and the output node,
wherein the resistance of the second and third resistor-capacitor circuits are selected to improve the linearity of the low noise amplifier without influencing the noise figure thereof.

7. The low noise amplifier of claim 6 wherein the second resistor-capacitor circuit comprises the series combination of a resistor and a capacitor coupled between the base of the second bipolar transistor and ground.

8. The low noise amplifier of claim 6 wherein the second resistor-capacitor circuit comprises the series combination of two diodes coupled between the base of the second bipolar transistor and ground.

9. The low noise amplifier of claim 6 wherein the second resistor-capacitor circuit comprises a resistor coupled between the base of the second bipolar transistor and the source of power supply voltage.

10. The low noise amplifier of claim 6 wherein the third resistor-capacitor circuit comprises comprises the series combination of a resistor and a capacitor coupled between the output node and ground.

11. The low noise amplifier of claim 6 wherein the third resistor-capacitor circuit comprises an inductor coupled between the collector of the second bipolar transistor and the source of power supply voltage.

12. The low noise amplifier of claim 6 wherein the first resistor-capacitor circuit comprises a microstrip coupled between the input node and ground.

13. The low noise amplifier of claim 6 wherein the first resistor-capacitor circuit comprises the series combination of a microstrip, a capacitor, and an inductor coupled between the input node and the base of the first bipolar transistor.

14. The low noise amplifier of claim 6 wherein the first resistor-capacitor circuit comprises the series combination of a resistor and a capacitor coupled through a microstrip and an inductor to the base of the first bipolar transistor.

15. The low noise amplifier of claim 14 further comprising an additional capacitor coupled to the series combination of the resistor and capacitor.

16. The low noise amplifier of claim 6 further comprising a bias current flowing between the source of power supply voltage and the first resistor-capacitor circuit.

17. The low noise amplifier of claim 6 further comprising an inductor interposed between the emitter of the first bipolar transistor and ground.

18. The low noise amplifier of claim 6 further comprising a resistor coupled between the output node and ground.

19. The low noise amplifier of claim 6 wherein the series resistance of the second and third resistor-capacitor circuits is substantially less than the capacitive impedance thereof at an operating frequency of the low noise amplifier.

* * * * *